United States Patent
Ono et al.

(10) Patent No.: US 10,209,826 B2
(45) Date of Patent: Feb. 19, 2019

(54) TOUCH SCREEN, TOUCH PANEL, DISPLAY DEVICE AND ELECTRONIC APPARATUS

(71) Applicant: Mitsubishi Electric Corporation, Tokyo (JP)

(72) Inventors: Takeshi Ono, Tokyo (JP); Tatsuya Nakamura, Tokyo (JP); Seiichiro Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 346 days.

(21) Appl. No.: 15/090,954

(22) Filed: Apr. 5, 2016

(65) Prior Publication Data

US 2016/0313860 A1    Oct. 27, 2016

(30) Foreign Application Priority Data

Apr. 21, 2015   (JP) .................................. 2015-086400

(51) Int. Cl.
| | |
|---|---|
| *G06F 3/041* | (2006.01) |
| *G06F 3/044* | (2006.01) |
| *G06F 1/16* | (2006.01) |
| *H05K 1/02* | (2006.01) |
| *H05K 1/16* | (2006.01) |

(52) U.S. Cl.
CPC .............. *G06F 3/0418* (2013.01); *G06F 1/16* (2013.01); *G06F 3/044* (2013.01); *H05K 1/0219* (2013.01); *H05K 1/162* (2013.01); *G06F 2203/04107* (2013.01); *H05K 2201/0108* (2013.01); *H05K 2201/09354* (2013.01); *H05K 2201/10128* (2013.01)

(58) Field of Classification Search
CPC ......... G06F 1/16; H05K 1/162; H05K 1/0219
See application file for complete search history.

(56) References Cited

U.S. PATENT DOCUMENTS

| | | | |
|---|---|---|---|
| 5,844,506 A | 12/1998 | Binstead | |
| 6,137,427 A | 10/2000 | Binstead | |
| 6,452,514 B1 | 9/2002 | Philipp | |
| RE40,867 E | 8/2009 | Binstead | |
| 2008/0062373 A1* | 3/2008 | Kim ...................... | G02F 1/1345 349/151 |
| 2010/0060602 A1* | 3/2010 | Agari ...................... | G06F 3/044 345/173 |
| 2011/0141550 A1* | 6/2011 | Ishida ............... | G02F 1/136204 359/296 |

(Continued)

FOREIGN PATENT DOCUMENTS

| | | |
|---|---|---|
| JP | H09-511086 A | 11/1997 |
| JP | 2003-526831 A | 9/2003 |

(Continued)

*Primary Examiner* — Michael A Faragalla
*Assistant Examiner* — Chayce R Bibbee
(74) *Attorney, Agent, or Firm* — Studebaker & Brackett PC

(57) ABSTRACT

A touch screen includes a first shield wiring surrounding a plurality of sensor wirings and a plurality of lead wirings, and capacitors. The distance between the first shield wiring and the outermost lead wiring which is the outermost wiring, out of the plurality of lead wirings, is larger than the intervals between the plurality of lead wirings. The capacitors are constituted by first and second electrodes including extending portions which extend in the extending direction.

10 Claims, 11 Drawing Sheets

(56) References Cited

U.S. PATENT DOCUMENTS

2013/0242485 A1    9/2013   Ohtani et al.
2016/0041651 A1    2/2016   Nakamura et al.

FOREIGN PATENT DOCUMENTS

| JP | 2012-103761 | A | 5/2012 |
|----|-------------|----|--------|
| JP | 5106471 | B2 | 10/2012 |
| JP | 2013-210247 | A | 10/2013 |
| WO | 95/27334 | A1 | 10/1995 |
| WO | 00/44018 | A1 | 7/2000 |

* cited by examiner

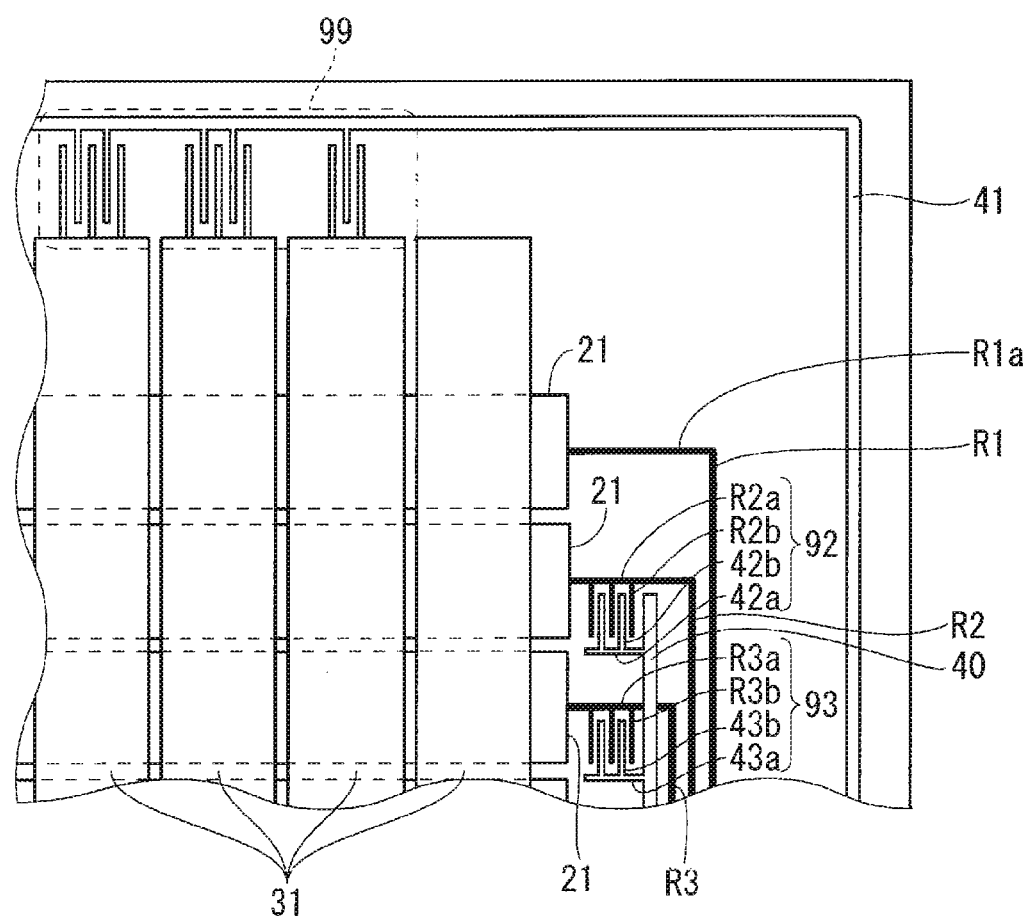
F I G. 5

F I G. 8
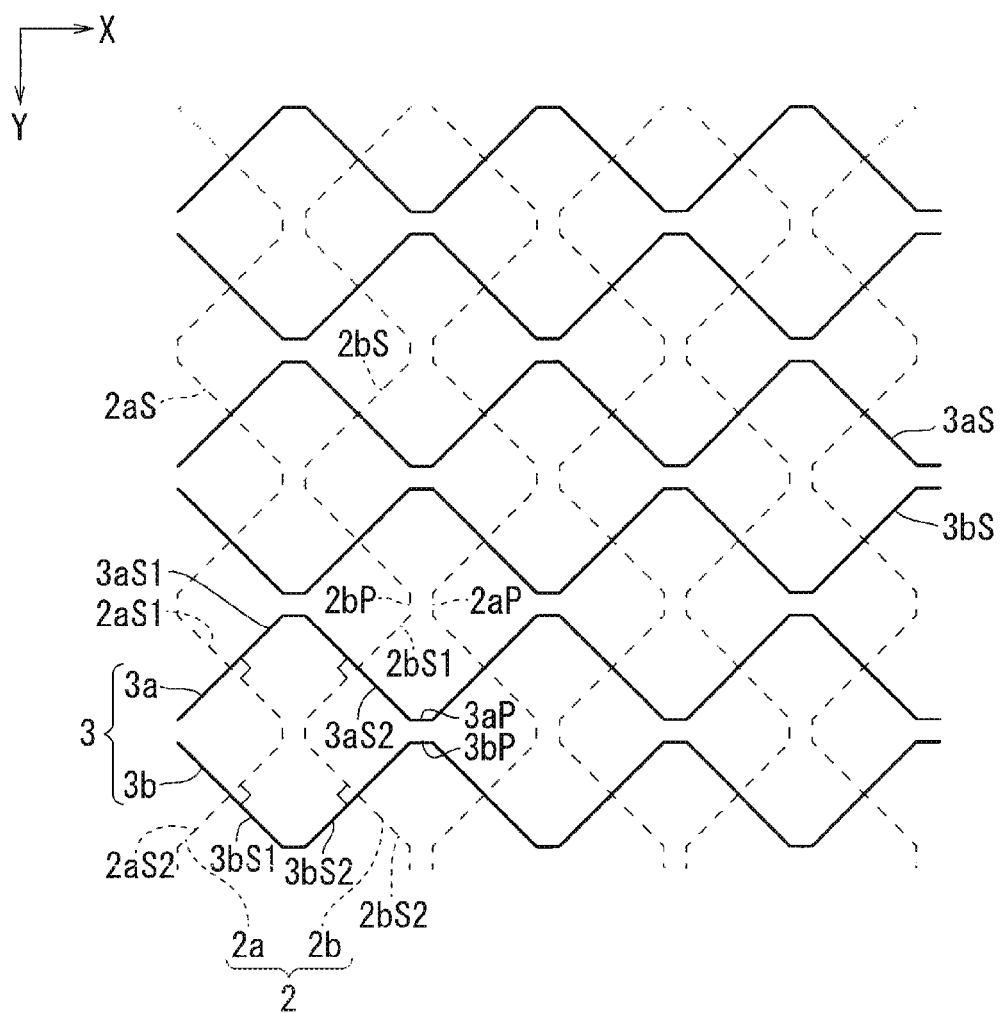

TOUCH SCREEN, TOUCH PANEL, DISPLAY DEVICE AND ELECTRONIC APPARATUS

BACKGROUND OF THE INVENTION

Field of the Invention

The present invention relates to a touch screen, a touch panel, a display device, and an electronic apparatus.

Description of the Background Art

Touch panels are devices for detecting touches by fingers and the like and for identifying positional coordinates of the touched positions. Attention has been focused on such touch panels as one type of excellent user interface means. Currently, touch panels of various types such as resistive-film types and capacitive types have been fabricated as products. In general, a touch panel includes a touch screen incorporating touch sensors, and a detection device for identifying coordinates of touched positions based on signals from the touch screen.

As one type of capacitive-type touch panels, there have been projected-capacitive type touch panels (refer to Japanese Patent Application Laid-Open No. 2012-103761, for example). Such a projected-capacitive type touch panel is capable of detecting touches, even in cases where the touch screen incorporating touch sensors is covered at its front surface side with a protective plate such as a glass plate with a thickness of about several millimeters. Touch panels of this type have excellent stiffness, because protective plates can be disposed on their front surfaces. Further, such touch panels are capable of detecting touches even by gloved hands. Further, such touch panels have longer lifetimes, because they have no movable portion which mechanically deforms.

A projected-capacitive type touch panel includes a first series of conductor elements formed on a thin dielectric film as detection wirings for detecting capacitances, and a second series of conductor elements formed on the first series of conductor elements with an insulation film interposed therebetween. Note that the respective conductor elements are not in electric contact with each other and three-dimensionally intersect with each other at a plurality of positions. Capacitances formed between an indication body such as a finger and the first series of conductor elements and the second series of conductor elements as the detection wirings are detected by a detection circuit, in order to identify positional coordinates of the position touched by the indication body. This detection method is generally referred to as a self-capacitance type detection method (refer to Japanese Unexamined Patent Application Publication (Translation of PCT Application) No. 9-511086 (1997), for example).

Further, for example, there are detection methods for identifying coordinates of touched positions, by detecting changes of electric fields, namely changes of mutual capacitances, between a plurality of column-direction wirings provided to extend in a column direction and a plurality of row-direction wirings provided to extend in a row direction. This detection method is generally referred to as a mutual capacitance detection method (refer to Japanese Unexamined Patent Application Publication (Translation of PCT Application) No. 2003-526831, for example).

Any of structures of the aforementioned self-capacitance types and mutual-capacitance types generally employ methods for identifying coordinates of touched positions, based on a balance between a detected value from a sensor block and detected values from detection cells therearound, if an indication body such as a finger touches a planar area (detection cells) sectioned in a lattice shape by column-direction wirings and row-direction wirings.

Generally, sensor capacitors are constituted by column-direction wirings and row-direction wirings, and it is desirable that the plurality of sensor capacitors is fabricated to have the same capacitance, ideally, in states where no physical quantity is exerted thereon. However, in structures having a touch panel combined with a display element such as a liquid crystal display panel, an extra parasitic capacitance is formed between an outer lead wiring in the touch screen and the display element such as a liquid crystal display panel. This causes the sensor capacitor (capacitance) corresponding to the outer lead wiring to have a different offset from the offsets of the sensor capacitors (capacitances) corresponding to the other lead wirings, in states where no physical quantity is exerted on the touch screen.

It is hard to differentiate such a capacitance offset which exists independently of physical quantities exerted thereon, from a difference in capacitances induced by physical quantities exerted thereon, based on the output voltage from the projected-capacitive type touch screen. This causes errors in detecting physical quantities. For coping therewith, there have been suggested methods for reducing variations in offsets of capacitances of a plurality of sensor capacitors.

Japanese Patent No. 5106471 discloses a touch screen which includes a plurality of lead wirings, and a dummy lead wiring provided along an outer end of at least one lead wiring, out of the outermost lead wirings in the opposite sides of the wiring bundle constituted by the aforementioned plurality of lead wirings. This document discloses that it is possible to suppress the variation in the capacitance offsets, because a predetermined electric potential is applied to the dummy lead wiring.

The technique in Japanese Patent No. 5106471 can suppress the capacitance offsets, in cases where the electric potential at the dummy lead wiring is almost equal to the electric potentials at the lead wirings. However, with this technique, the electric potential at the dummy lead wiring may be made different from the electric potentials at the lead wirings, in some cases. In such cases, the capacitance offsets have been occasionally increased due to coupling between the dummy lead wiring and the lead wirings.

SUMMARY OF THE INVENTION

The present invention has been made in view of the aforementioned problem and aims at providing a technique capable of reducing capacitance variations.

According to the present invention, there is provided a touch screen which includes a plurality of sensor wirings, a plurality of lead wirings, a first shield wiring, and a capacitor. The plurality of sensor wirings extends in a predetermined extending direction. The plurality of lead wirings is connected to end portions of the plurality of sensor wirings and extends along an outer periphery of an area in which the plurality of sensor wirings is disposed. The first shield wiring surrounds the plurality of sensor wirings and the plurality of lead wirings. The capacitor is constituted by a first electrode and a second electrode which are apart from each other and is connected to the end portions of the sensor wirings. A distance between the first shield wiring and an outermost lead wiring which is an outermost wiring, out of the plurality of lead wirings, is larger than intervals between the plurality of lead wirings. Each of the first electrode and the second electrode includes an extending portion extending in the extending direction.

Since there is provided the larger interval between the outermost lead wiring and the first shield wiring, it is possible to reduce the capacitance variation.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 and 5 are plan views illustrating the structure of the touch screen according to the first preferred embodiment;

FIG. 8 is a plan view illustrating the structure of column-direction wirings and row-direction wirings, according to the first preferred embodiment;

DESCRIPTION OF THE PREFERRED EMBODIMENTS

First Preferred Embodiment

At first, with reference to FIGS. 1 to 8, there will be described a touch screen 1 according to a first preferred embodiment of the present invention. Note that the touch screen 1 according to the present first preferred embodiment will be described as being a projected-capacitive type touch screen, but is not limited thereto.

Figure 1:
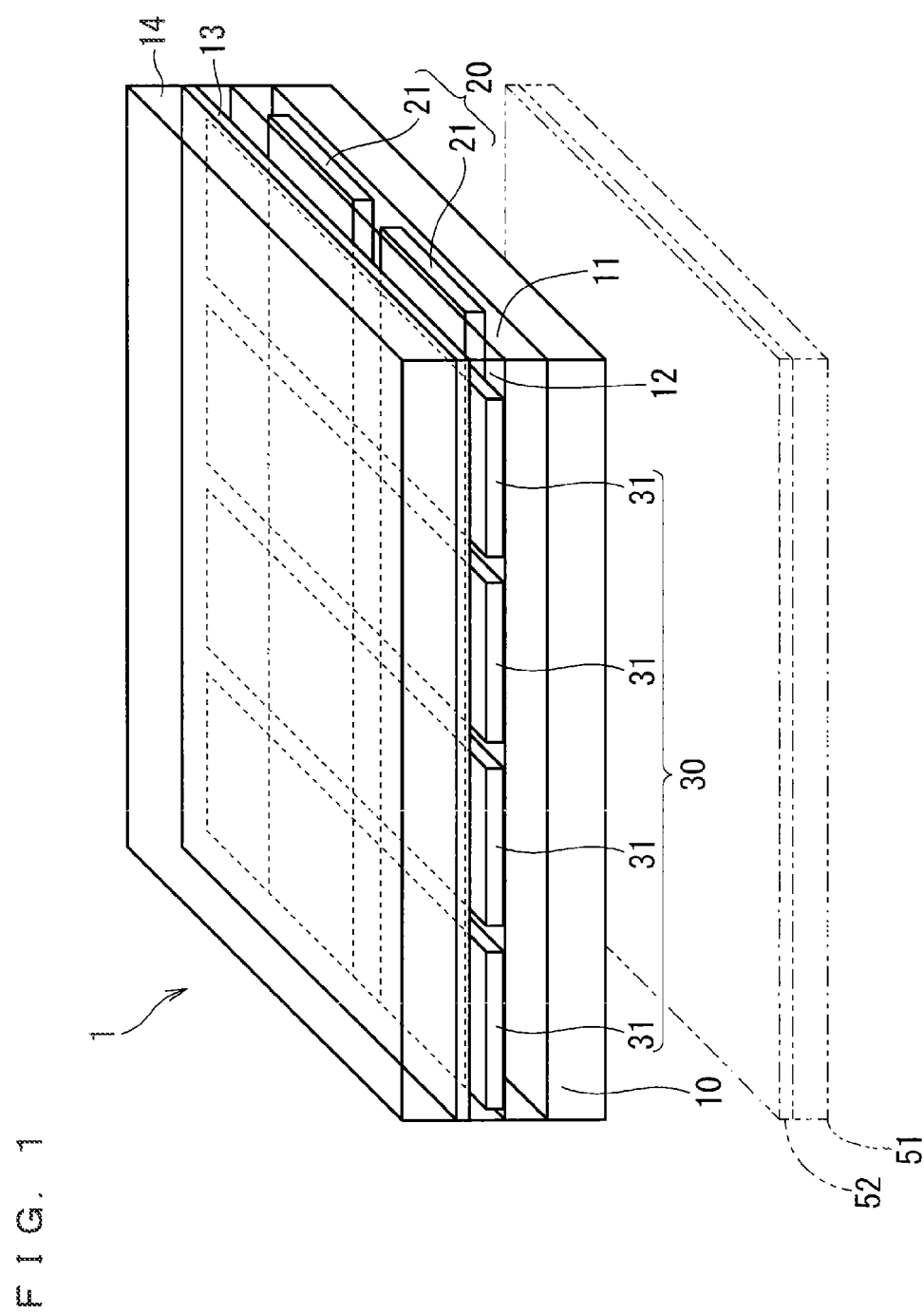
FIG. 1 is a perspective view illustrating the layer configuration in a touch screen according to a first preferred embodiment.

FIG. 1 is a perspective view illustrating the layer configuration in the touch screen 1 according to the present first preferred embodiment. Referring to FIG. 1, the touch screen 1 has a lowermost surface layer which is constituted by a transparent substrate 10 formed from a transparent glass material or a transparent resin. A lower electrode 20 is disposed on the transparent substrate 10. Further, an inter-layer insulation film 11 is disposed in such a way as to cover the lower electrode 20. The inter-layer insulation film 11 is a transparent insulation film such as a silicon nitride film or a silicon oxide film. An upper electrode 30 is disposed on the upper surface of the inter-layer insulation film 11.

Further, a protective film 12 is disposed on the upper surface of the inter-layer insulation film 11, in such a way as to cover the upper electrode 30. The protective film 12 is a film with an insulating property and translucency, such as a silicon nitride film, similarly to the inter-layer insulation film 11. A liquid-crystal-display polarization plate (not illustrated), to which the touch screen 1 is mounted, is attached to the upper surface of the protective film 12. Then, an adhesive member 13 is disposed on the upper surface of this polarization plate. Further, in order to protect the touch screen 1, on the upper surface of the adhesive member 13, a transparent substrate 14 forming the surface of the touch screen 1 is bonded to the aforementioned polarization plate, through the adhesive member 13. Note that the transparent substrate 14 is formed from a transparent glass material or a transparent resin, for example.

The lower electrode 20 includes a plurality of column-direction wirings 21 formed from a transparent wiring material such as ITO (Indium Tin Oxide) or a metal wiring material such as aluminum or copper. Further, the upper electrode 30 includes a plurality of row-direction wirings 31 formed from a transparent wiring material such as ITO or a metal wiring material such as aluminum or copper, similarly to the lower electrode 20.

In the present first preferred embodiment, each of the aforementioned row-direction wirings 31 and the aforementioned column-direction wirings 21 are formed from a multi-layer configuration constituted by an aluminum-based alloy layer and a layer of nitride of the aluminum-based alloy. This can lower the wiring resistance and can lower the light reflectivity in a detectable area. Further, in the present first preferred embodiment, the row-direction wirings 31 are disposed on the column-direction wirings 21, but the positional relationship therebetween can be inversed, and the column-direction wirings 21 can be disposed on the row-direction wirings 31. Further, the materials of the row-direction wirings 31 and the column-direction wirings 21 are uniformly formed from a multi-layer configuration constituted by an aluminum-based alloy layer and a layer of nitride of the aluminum-based alloy. However, it is not necessary to uniformize the materials of them. For example, the material of the row-direction wirings 31 is formed from a multi-layer configuration constituted by an aluminum-based alloy layer and a layer of nitride of the aluminum-based alloy, while the column-direction wirings 21 can be made of a transparent wiring material such as ITO.

Further, while, in the present first preferred embodiment, the row-direction wirings 31 are disposed on the column-direction wirings 21, they can be disposed in the same layer and, only at the portions where the column-direction wirings 21 and the row-direction wirings 31 overlap with each other in a plan view, the inter-layer insulation film 11 can be disposed between these wirings for electrically separating these wirings from each other.

A user performs manipulations by touching the transparent substrate 14 forming the surface of the touch screen 1 with an indication body such as a finger. If the indication body touches the transparent substrate 14, this induces a capacitance coupling (touch capacitance) between the indication body and at least one of the column-direction wirings 21 and the row-direction wirings 31 under the transparent substrate 14. In cases of mutual-capacitance types, it is identified which position in the detectable area has been touched by the indication body, based on the change of the mutual capacitances between the column-direction wirings 21 and the row-direction wirings 31, the change having been induced by the occurrence of this touch capacitance.

Note that in FIG. 1, a display element 51 and an adhesive member 52 are also illustrated by imaginary lines (two-dot chain lines), in addition to the touch screen 1. As the display element 51, a display panel is employed, such as a liquid crystal display element or an LCD (liquid crystal display device) panel, for example.

Figure 2:
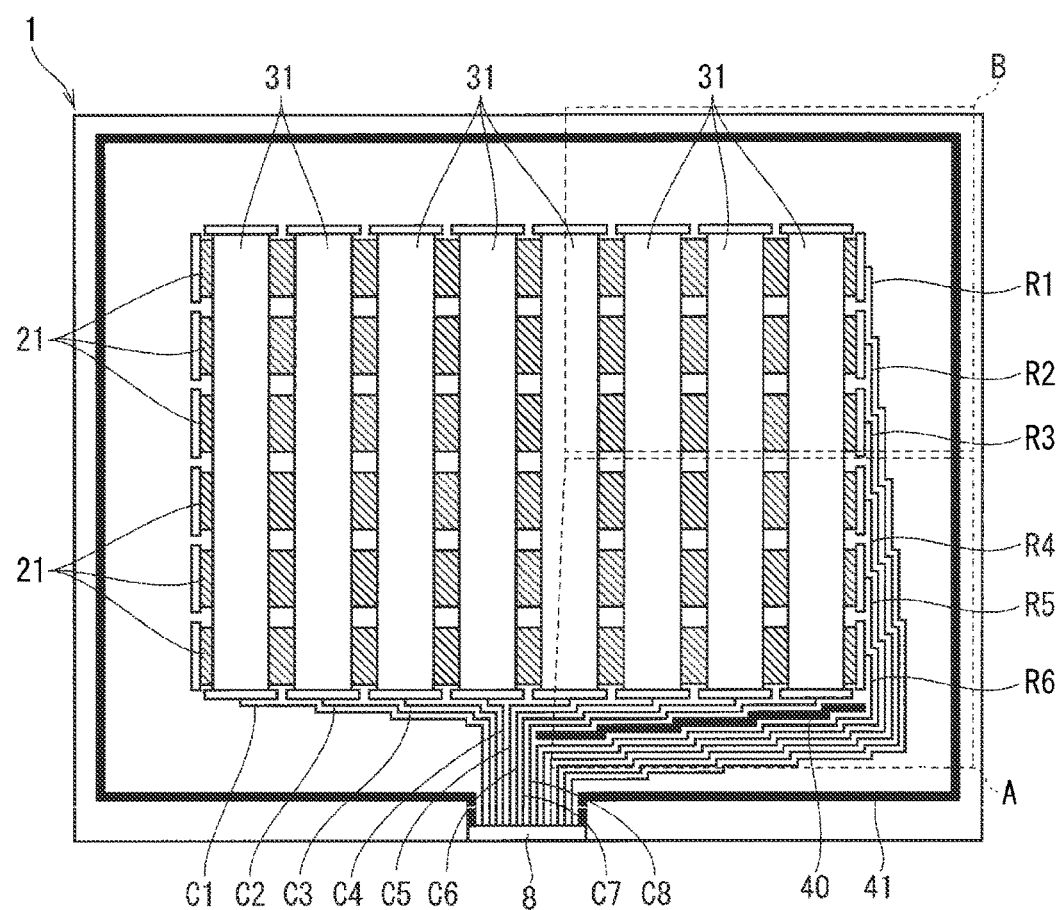
FIG. 2 is a plan view illustrating the structure of the touch screen according to the first preferred embodiment.

FIG. 2 is a plan view illustrating the structure of the touch screen 1 according to the present first preferred embodiment. The detectable area in the touch screen 1 is a matrix area formed by the plurality of the column-direction wirings 21 extending in the lateral direction (the column direction) and the plurality of the row-direction wirings 31 extending in the longitudinal direction (the row direction) which overlap with each other in a plan view. Hereinafter, the description will be given, assuming that a plurality of sensor wirings extending along a predetermined extending direction is the column-direction wirings 21, and the detectable area is the area in which the column-direction wirings 21 are disposed. However, the present invention is not limited thereto, and the row-direction wirings 31 can also be applied thereto instead of the column-direction wirings 21, or both the column-direction wirings 21 and the row-direction wirings 31 can also be applied thereto.

The respective column-direction wirings 21 are connected to terminals 8 for connecting them to an external wiring, through lead wirings R1 to R6 (a plurality of lead wirings). Further, similarly, the respective row-direction wirings 31 are connected to the terminals 8 for connecting them to the external wiring, through lead wirings C1 to C8.

The lead wirings R1 to R6 are connected to end portions of the column-direction wirings 21 and, also, extend along the outer periphery of the detectable area. Here, when the lead wiring R5 reaches the lead wiring R6 in the direction of the outer periphery of the detectable area, the lead wiring R5 extends along the lead wiring R6 outside the leant wiring R6 (in the opposite side to the detectable area). Note that the lead wirings R1 to R4 are also disposed similarly to the lead wiring R5.

In the present first preferred embodiment, the lead wirings R1 to R6 are disposed such that they are close to the outer peripheral side of the detectable area. Further, similarly, the lead wirings C1 to C8 are also disposed such that they are closer to the outer peripheral side of the detectable area, as the lead wiring closer to the terminal 8. By disposing the lead wirings R1 to R6 and the lead wirings C1 to C8 such that they are as close as possible to the outer peripheral side of the detectable area, as described above, it is possible to suppress fringe capacitances between the display element 51 to which the touch screen 1 is mounted, and the respective lead wirings R2 to R6 and C2 to C8 other than the lead wirings R1 and C1.

Note that in the following description, the lead wiring R1 in the outermost side (in the opposite side to the detectable area), out of the lead wirings R1 to R6, will be referred to as "the outermost lead wiring R1," in some cases. Further, the lead wiring C1 in the outermost side (in the opposite side to the detectable area), out of the lead wirings C1 to C8, will be referred to as "the outermost lead wiring C1," in some cases.

As illustrated in FIG. 2, outside the outermost lead wirings R1 and C1, there is disposed an outermost shield wiring 41 as a first shield wiring surrounding the plurality of column-direction wirings 21, the plurality of row-direction wirings 31, and the lead wirings R1 to R6 and C1 to C8. Note that a ground electric potential is applied to the outermost shield wiring 41.

Here, in the present first preferred embodiment, the lead wirings R1 to R6 are disposed at even intervals, and the distance between the outermost lead wiring R1 and the outermost shield wiring 41 is made larger than the intervals between the aforementioned lead wirings R1 to R6.

Figure 3:
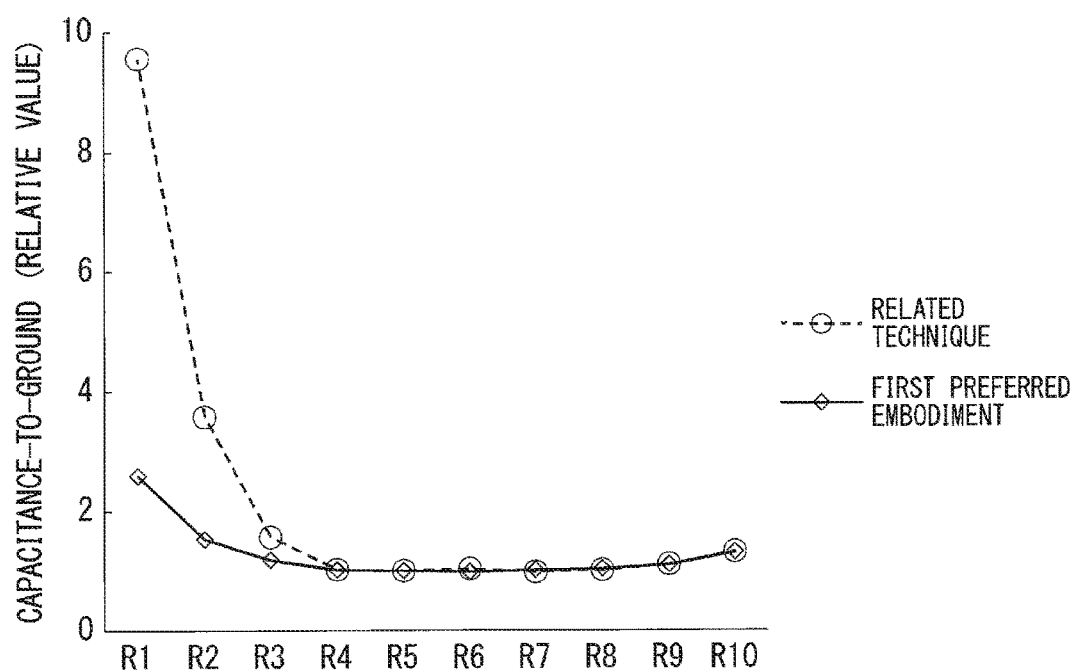
FIG. 3 is a view illustrating results of simulations for relative values of capacitances-to-ground, in the touch screen according to the first preferred embodiment.

FIG. 3 illustrates results of simulations for relative values of capacitances-to-ground, in cases where ten lead wirings R1 to R10 are disposed. In FIG. 3, the capacitance-to-ground of the lead wiring R5 is used as a reference, and the relative value of the capacitance-to-ground of the lead wiring R5 is "1."

Note that a touch screen employed as the touch screen according to the present first preferred embodiment was adapted such that the intervals between the lead wirings R1 to R10 were 10 micrometers, and the interval between the outermost shield wiring 41 and the outermost lead wiring R1 was 200 micrometers, which was larger than the intervals between the lead wirings R1 to R10. A touch screen employed as a touch screen regarding related techniques was adapted such that the intervals between the lead wirings R1 to R10 were 10 micrometers, and the interval between the outermost shield wiring 41 and the outermost lead wiring R1 was 10 micrometers, which was equal to the intervals between the lead wirings R1 to R10. As illustrated in FIG. 3, according to the present first preferred embodiment, the capacitance-to-ground of the outermost lead wiring R1 is smaller than that of the related techniques.

Figure 4:
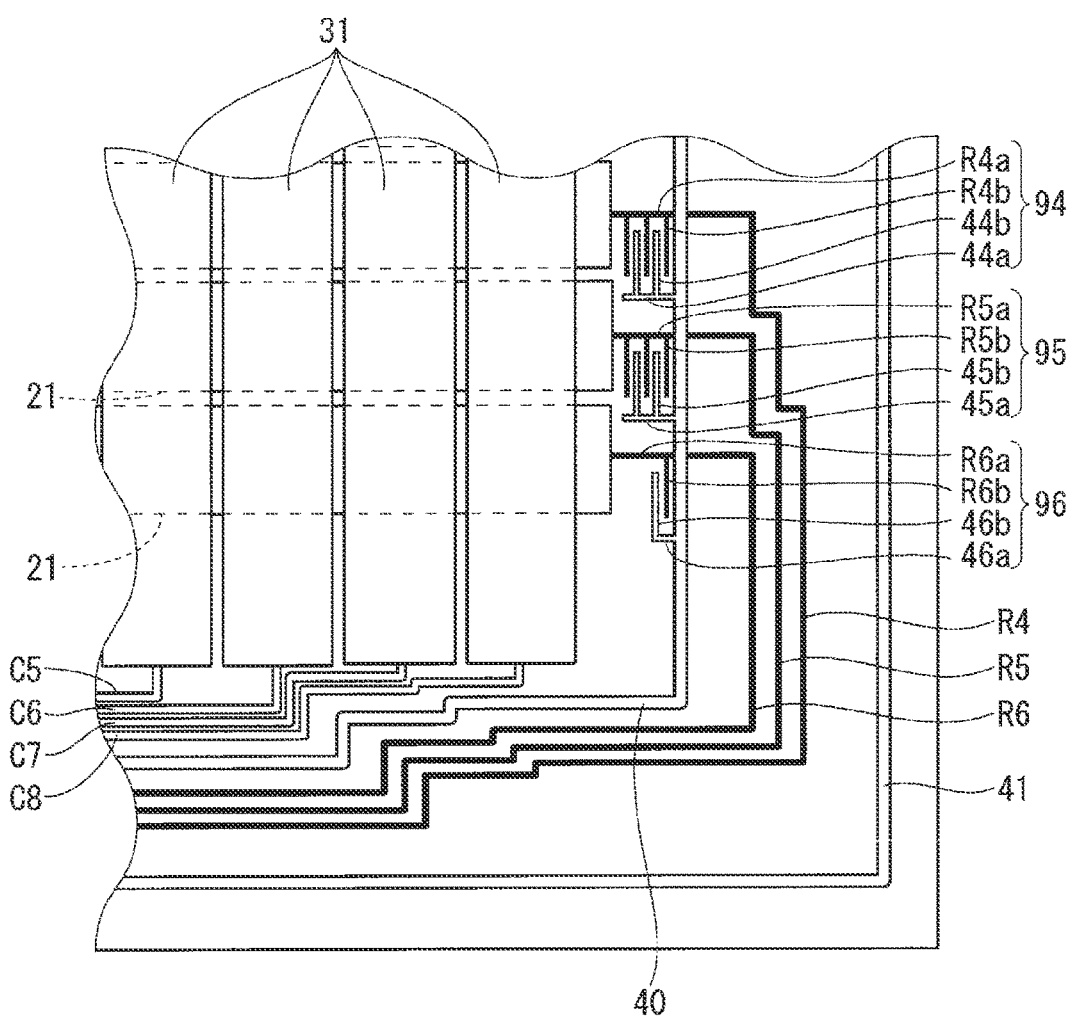

FIG. 4 is a plan view enlarging the area A in FIG. 2, and FIG. 5 is a plan view enlarging the area B in FIG. 2. As illustrated in FIGS. 4 and 5, the lead wiring R1 includes a connection portion R1a extending from the point at which the lead wiring R1 is connected to an end portion of the corresponding column-direction wiring 21 along an extension line of this column-direction wiring 21. Similarly, the lead wirings R2 to R6 include respective connection portions R2a to R6a extending from the points at which the lead wirings R2 to R6 are connected to end portions of the corresponding column-direction wirings 21 along extension lines of these column-direction wirings 21.

Further, as illustrated in FIGS. 4 and 5, a shield wiring 40 as a second shield wiring is disposed in parallel with the row direction in which the row-direction wirings 31 extend, outside the detectable area. The shield wiring 40 is connected to correction capacitance electrodes 42a to 46a, and the ground electric potential is applied to the shield wiring 40. The correction capacitance electrode 42a is disposed in the row direction (in the direction perpendicular to the extending direction of the column-direction wirings 21) in which the row-direction wirings 31 extend, with respect to the connection portion R2a of the lead wiring R2. Similarly, the correction capacitance electrodes 43a to 46a are disposed in the row direction (in the direction perpendicular to the extending direction of the column-direction wirings 21) in which the row-direction wirings 31 extend, with respect to the connection portions R3a to R6a of the lead wirings R3 to R6.

Here, in the present first preferred embodiment, capacitors 92 to 96 constituted by first and second electrodes spaced apart from each other are connected to the end portions of the respective column-direction wirings 21.

The first electrode of the capacitor 92, out of them, includes the connection portion R2a (the extending portion) extending in the extending direction of the column-direction wirings 21, and a first pectinate portion R2b extending in the direction perpendicular to the extending direction of the column-direction wirings 21. Then, the second electrode of the capacitor 92 includes the correction capacitance electrode 42a (the extending portion) extending in the extending direction of the column-direction wirings 21, and a second pectinate portion 42b which extends in the direction perpendicular to the extending direction of the column-direction wirings 21 and engages with the first pectinate portion R2b.

Similarly, the first electrode of each of the capacitors 93 to 96 includes the connection portions R3a to R6a extending in the extending direction of the column-direction wirings 21, and first pectinate portions R3b to R6b extending in the direction perpendicular to the extending direction of the column-direction wirings 21. Then, the second electrode of each of the capacitors 93 to 96 includes the correction capacitance electrodes 43a to 46a extending in the extending direction of the column-direction wirings 21, and a second pectinate portions 43b to 46b which extend in the direction perpendicular to the extending direction of the column-direction wirings 21 and engage with the first pectinate portions R3b to R6b.

Note that the lead wirings R1 to R6 and the first electrodes (the connection portions R2a to R6a and the first pectinate portions R2b to R6b) are isolated (insulated) from the shield wiring 40 and the second electrodes (the correction capacitance electrodes 42a to 46a and the second pectinate portions 42b to 46b), by the inter-layer insulation film 11 (FIG. 1).

With the aforementioned structure according to the present first preferred embodiment, it is possible to reduce the variation in the capacitances formed in the lead wirings R1 to R6, by properly adjusting the capacitances of the aforementioned capacitors 92 to 96. Further, the first and second electrodes forming the capacitors 92 to 96 each include the correction capacitance electrodes 42a to 46a and the connection portions R2a to R6a which extend in the column direction (the extending direction) of the column-direction wirings 21, and the correction capacitance electrodes 42a to 46a are disposed in the row direction (the direction perpendicular to the extending direction), with respect to the connection portions R2a to R6a. Namely, it is possible to provide a leeway in the space in the column direction, in comparison with structures having first and second electrodes of capacitors which are disposed in the column direction (for example, structures having correction capacitance electrodes 42a to 46a disposed in the column direction with respect to lead wirings R2 to R6). Therefore, with the same device size, it is possible to provide a larger interval between the aforementioned outermost lead wiring R1 and the outermost shield wiring 41, which can enhance the effect of reducing the variation in the capacitances formed in the lead wirings R1 to R6 (the column-direction wirings 21).

Further, in the present first preferred embodiment, the first electrodes include the first pectinate portions R2b to R6b, while the second electrodes include the second pectinate portions 42b to 46b. This structure enables adjusting the capacitances with a smaller space.

Note that as illustrated in FIG. 5, the capacitors 92 to 96 are connected to the lead wirings R2 to R6 other than the outermost lead wiring R1, but no capacitor is connected to the outermost lead wiring R1. This structure enables reducing the capacitance adjustment range by the amount of non-connection of a capacitor to the outermost lead wiring R1. This can reduce the capacitance variation after the capacitance adjustment. Note that as described above, the outermost lead wiring R1 has a largest capacitance-to-ground, in general. Therefore, it is only necessary to adjust the capacitors 92 to 96 connected to the lead wirings R2 to R6 such that the capacitances of the other lead wirings R2 to R6 are equal to the capacitance-to-ground of the outermost lead wiring R1, and it is not necessary to connect a capacitor to the outermost lead wiring R1.

Further, in the present first preferred embodiment, the shield wiring 40 is structured such that it does not overlap with the lead wiring R2 adjacent to an inner side of the outermost lead wiring R1, in a plan view. Namely, the shield wiring 40 has no portion which three-dimensionally intersects with the lead wiring R2. Here, assuming that the shield wiring 40 is structured to have such a three-dimensionally-intersecting portion near its termination end portion, if an electric charge is induced therein due to electrostatic discharge from the outside, this is relatively liable to induce a failure due to an insulation breakdown of the inter-layer insulation film 11 at this three-dimensionally-intersecting portion. On the contrary, with the aforementioned structure according to the present first preferred embodiment, it is possible to suppress the occurrence of such an insulation breakdown.

Note that as illustrated in FIG. 5, it is also possible to connect a capacitor 99 constituted by first and second electrodes which include extending portions extending in the extending direction of the row-direction wirings 31 and are apart from each other, to end portions of the row-direction wirings 31. The capacitor 99 has substantially the same structure as that of the capacitors 92 to 96 and, therefore, this capacitor 99 can provide the same effects as those of the capacitors 92 to 96.

Figure 6:
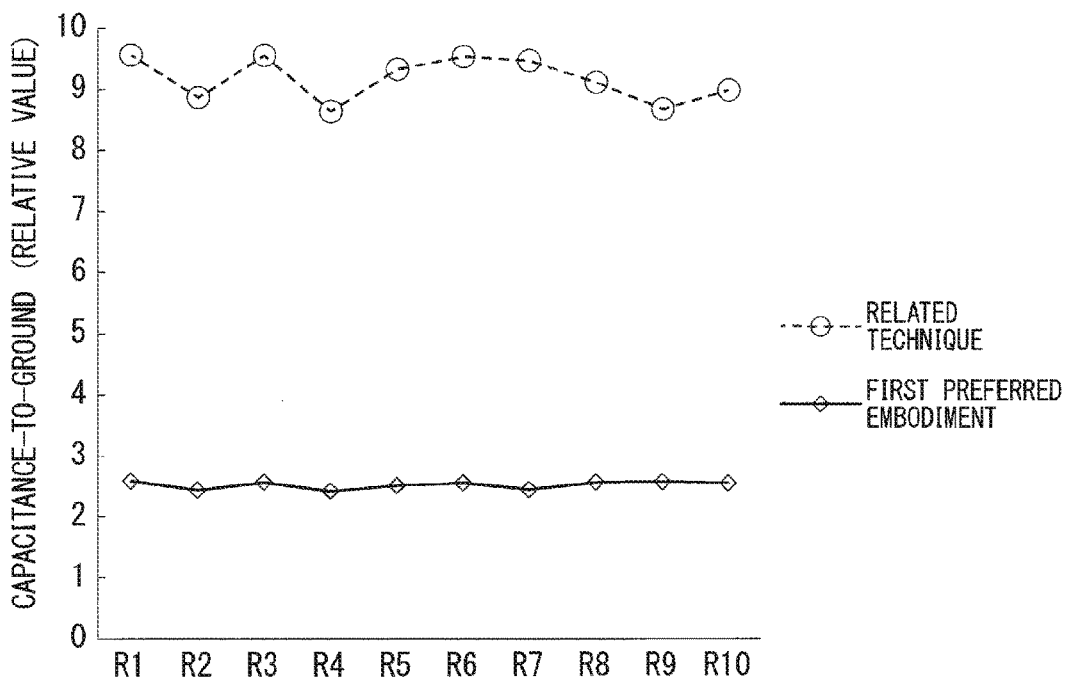
FIG. 6 is a view illustrating results of actual measurements of relative values of capacitances-to-ground, in the touch screen according to the first preferred embodiment.

FIG. 6 illustrates results of actual measurements of relative values of capacitances-to-ground (the present first preferred embodiment and related techniques), after the ten lead wirings R1 to R10 were disposed, and the capacitors (the correction capacitance electrodes) were disposed. Note that a touch screen employed as a touch screen regarding the related techniques was adapted such that the intervals between the lead wirings R1 to R10 and the interval between the outermost shield wiring 41 and the outermost lead wiring R1 were all 10 micrometers. In FIG. 6, the capacitance-to-ground of the lead wiring R5 illustrated in FIG. 3 is used as a reference.

According to the present first preferred embodiment, the capacitance-to-ground variation caused by fabrication tolerances was about 6%, while the capacitance-to-ground variation caused by fabrication tolerances was about 37% according to the related techniques. As described above, according to the present first preferred embodiment, it was possible to reduce the capacitance-to-ground variation caused by fabrication tolerances.

Further, in the present first preferred embodiment, the first and second electrodes in the capacitors 92 to 96 are disposed such that they are close to each other without overlapping with each other in a plan view. With this structure, the capacitances are coupled substantially in the planar direction, while the capacitances are not coupled in the film-thickness direction. Through the capacitance adjustment of the former, it is possible to suppress the capacitance variation caused by the film-thickness variation, which is difficult to suppress through the capacitance adjustment of the latter. This can enhance the effect of reducing the variation in the capacitances formed in the lead wirings R1 to R6 (the column-direction wirings 21).

Figure 7:
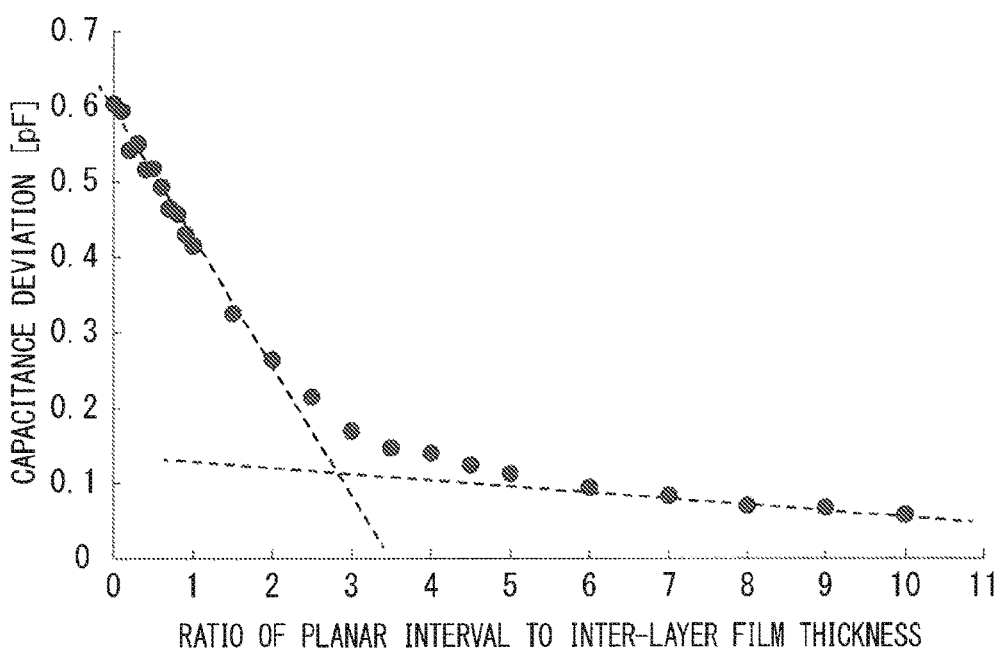
FIG. 7 is a view illustrating the relationship between an actually-measured value of a capacitance deviation, and the ratio of a planar interval to the film thickness of an inter-layer insulation film, in the touch screen according to the first preferred embodiment.

FIG. 7 illustrates the relationship between the actually-measured value of the capacitance deviation, and the ratio of the interval (the planar interval) between the first and second electrodes in a plan view to the film thickness of the inter-layer insulation film 11. Here, the ratio of the planar interval to the film thickness of the inter-layer insulation film 11 was varied by degrees and, for each of the conditions of these varied ratios, 30 samples were prepared such that each sample was designed to have a capacitance value of 5 pF. The capacitances of all the samples were actually measured, and the capacitance deviation (the standard deviation of the capacitances) was determined for each of the conditions.

As a result thereof, the capacitance variation decreased, as the planar interval with respect to the film thickness of the inter-layer insulation film 11 was made larger. Particularly, when the planer interval was three times the film thickness of the inter-layer insulation film 11, there was a prominent effect of reducing the capacitance variation. In view of this fact, from the standpoint of further reducing the capacitance variation caused by fabrication tolerances, it is preferable that the planar interval be equal to or more than three times the film thickness of the inter-layer insulation film 11.

FIG. 8 is a plan view illustrating, in detail, the configurations of detection column wirings 3 forming the column-direction wirings 21, and detection row wirings 2 forming the row-direction wirings 31. Next, with reference to FIG. 8, there will be described, in detail, the configurations of the detection column wirings 3 and the detection row wirings 2.

As illustrated in FIG. 8, each detection row wiring 2 is constituted by a pair of (1) a first metal wiring 2a and (2) a second metal wiring 2b, wherein the first metal wiring 2a has a zigzag pattern formed by first inclined portions 2aS and first parallel portions 2aP which are repeatedly disposed in a zigzag shape along the row direction y, the first inclined portions 2aS are obliquely inclined by an inclination angle of 45 degrees with respect to the row direction y, the first parallel portions 2aP are parallel with the row direction y and are continuous with the first inclined portions 2aS, and the second metal wiring 2b is structured such that the second metal wiring 2b and the first metal wiring 2a are symmetric with respect to the row direction y as an axis.

Similarly, each detection column wiring 3 is constituted by a pair of (3) a third metal wiring 3a and (4) a fourth metal wiring 3b, wherein the third metal wiring 3a has a zigzag pattern formed by second inclined portions 3aS and second parallel portions 3aP which are repeatedly disposed in a zigzag shape along the column direction x, the second inclined portions 3aS are obliquely inclined by an inclination angle of 45 degrees with respect to the column direction x, the second parallel portions 3aP are parallel with the column direction x and are continuous with the second inclined portions 3aS, and the fourth metal wiring 3b is structured such that the fourth metal wiring 3b and the third metal wiring 3a are symmetric with respect to the column direction x as an axis.

Furthermore, there is established the following positional relationship, in each area in which any single detection row wiring out of the plurality of detection row wirings 2, and any single detection column wiring out of the plurality of detection column wirings 3, intersect with each other.

Namely, out of the two first inclined portions 2aS of the first metal wiring 2a which belongs to any of the areas, one inclined portion 2aS1 three-dimensionally intersects at its middle point (the center portion) with one inclined portion 3aS1 out of the two second inclined portions 3aS of the third metal wiring 3a which belongs to this area, at its middle point (its center portion). Further, out of the two first inclined portions 2aS of the first metal wiring 2a which belongs to any of the areas, the other inclined portion 2aS2 three-dimensionally intersects at its middle point (the center portion) with one inclined portion 3bS1 out of the two second inclined portions 3bS of the fourth metal wiring 3b which belongs to this area, at its middle point (its center portion).

In addition, out of the two first inclined portions 2bS of the second metal wiring 2b which belongs to any of the areas, one inclined portion 2bS1 three-dimensionally intersects at its middle point (the center portion) with the other inclined portion 3aS2 out of the two second inclined portions 3aS of the third metal wiring 3a which belongs to this area, at its middle point (its center portion). Further, out of the two first inclined portions 2bS of the second metal wiring 2b which belongs to any of the areas, the other inclined portion 2bS2 three-dimensionally intersects at its middle point (the center portion) with the other inclined portion 3bS2 out of the two second inclined portions 3bS of the fourth metal wiring 3b which belongs to this area, at its middle point (its center portion). By setting the orthogonal relationship between the inclined portions as described above, the sizes of the parallel portions 2aP and 2bP along the row direction y, and the sizes of the parallel portions 3aP and 3bP along the column direction x are minimized.

With the present structure illustrated in FIG. 8, it is possible to minimize the values of parasitic capacitances induced between the wirings, which are the detection row wirings 2 and the detection column wirings 3. Further, with the present structure, it is possible to reduce the total area of the portions where the detection row wirings 2 and the detection column wirings 3 do not exist in a plan view, in comparison with cases of not employing the present structure. This enables uniformly detecting the touch capacitance formed from the capacitance between a detection row wiring 2 and the indication body such as a finger and from the capacitance between a detection column wiring 3 and the indication body, in each area.

Here, there will be assumed a structure of the touch screen 1 on which the display element 51 is mounted such that the column direction x and the row direction y of the touch screen 1 in FIG. 8 are parallel with the column direction and the row direction, respectively, of the pixel pattern in the display element 51 (such as an LCD panel) which is mounted to the touch screen 1. With this structure, the respective zigzag patterns 2a, 2b, 3a and 3b in the detection row wirings 2 and the detection column wirings 3 are disposed for each pixel, in oblique directions which are inclined by an angle of 45 degrees with respect to the respective directions of arrangements of the pixel pattern, in the column direction and the row direction, thereby uniformly covering a portion of each pixel. Accordingly, with the aforementioned present structure, it is possible to uniformize the transmittance when the display light emitted from the display element 51 passes through the touch screen 1 and, further, it is possible to suppress the occurrence of moire phenomena.

Further, since the column-direction wirings 21 and the row-direction wirings 31 are formed to be mesh-type wirings as in the present first preferred embodiment, it is possible to cover the wide detectable area with a smaller wiring area. However, the materials, the shapes and the like of the column-direction wirings 21 and the row-direction wirings 31 are not limited to those in the aforementioned description.

Further, as the materials of the column-direction wirings 21 and the row-direction wirings 31, it is possible to employ a transparent conductive material such as ITO or graphene, or a metal material such as aluminum, chromium, copper or silver. Alternatively, as the materials of them, it is possible to employ alloys formed from aluminum, chromium, copper, silver and the like, or multi-layer configurations formed from aluminum nitride and the like formed on these alloys. However, the conductive wiring widths and the mesh intervals are not limited to those in the aforementioned description and can also be properly changed according to the application and the like of the touch screen 1.

Conclusion of First Preferred Embodiment

In the touch screen 1 according to the present first preferred embodiment as described above, the distance between the outermost lead wiring R1 and the outermost shield wiring 41 is made larger than the intervals between the aforementioned lead wirings R1 to R6. This can reduce the capacitance-to-ground of the outermost lead wiring R1. Further, the first and second electrodes forming the capacitors 92 to 96 include the correction capacitance electrodes 42a to 46a and the connection portions R2a to R6a, respectively, which extend in the column direction (the extending direction) of the column-direction wirings 21, and the correction capacitance electrodes 42a to 46a are disposed in the row direction (the direction perpendicular to the extending direction), with respect to the connection portions R2a to R6a. This can provide a relatively-larger interval between the aforementioned outermost lead wiring R1 and the outermost shield wiring 41, which can reduce the variation in the capacitances formed in the lead wirings R1 to R6 (the column-direction wirings 21), the deviation in the parasitic capacitances in the wirings and, consequently, the deviation in the capacitance detecting sensitivities.

Second Preferred Embodiment

A second preferred embodiment of the present invention defines the bonding position of the adhesive member 52 (FIG. 1) for bonding the display element 51 to the touch screen 1 according to the first preferred embodiment, which can reduce the capacitances-to-ground of the lead wirings, and further reduce the capacitance variation. Note that the structure of the touch screen 1 is the same as that described with reference to FIGS. 1 to 8 in the first preferred embodiment.

Figure 9:
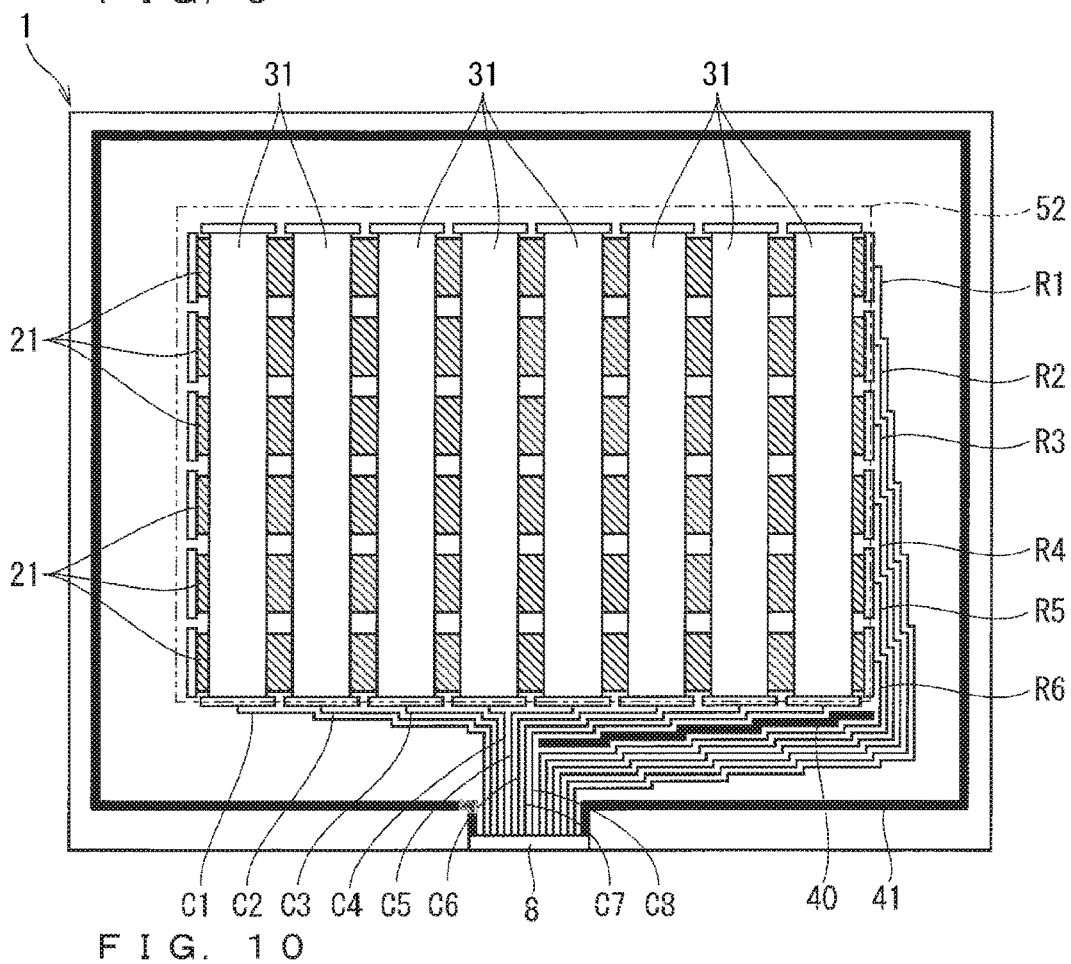
FIG. 9 is a plan view illustrating the structure of a touch screen according to a second preferred embodiment.

FIG. 9 is a plan view illustrating the structure of the touch screen 1 according to the present second preferred embodiment. The lead wirings R1 to R6 and C1 to C8, the column-direction wirings 21 and the row-direction wirings 31 are the same as those in the first preferred embodiment and, therefore, will not be described.

In FIG. 9, an imaginary line (two-dot chain line) indicates the outer contour line of the adhesive member 52 which bonds the touch screen 1 and the display element 51 to each other. As indicated by the two-dot chain line, the outer contour line of the adhesive member 52 is positioned between a group of the column-direction wirings 21 and the row-direction wirings 31 and a group of the lead wirings R1 to R6 and C1 to C8 in a plan view. Namely, the touch screen 1 is bonded to the display element 51, through the adhesive member (the first adhesive member) 52 which is disposed in such a way as to overlap with the plurality of column-direction wirings 21 while not overlapping with the lead wirings R1 to R6 and C1 to C8, in the plan view.

The adhesive member 52 has a larger permittivity than that of an air layer and, therefore, causes relatively-strong coupling between the lead wirings in the touch screen 1 and electrodes in the display element 51 bonded to the touch screen 1. For example, in a case where the display element 51 is an IPS (In Plane Switching) (trademark) liquid crystal display, relatively-strong coupling is caused between an antistatic transparent electrode and the like and the lead wirings. On the contrary, with the aforementioned structure according to the present second preferred embodiment, it is possible to weaken the coupling between the lead wirings and the electrodes and the like in the display element 51, as will be described later.

Figure 10:
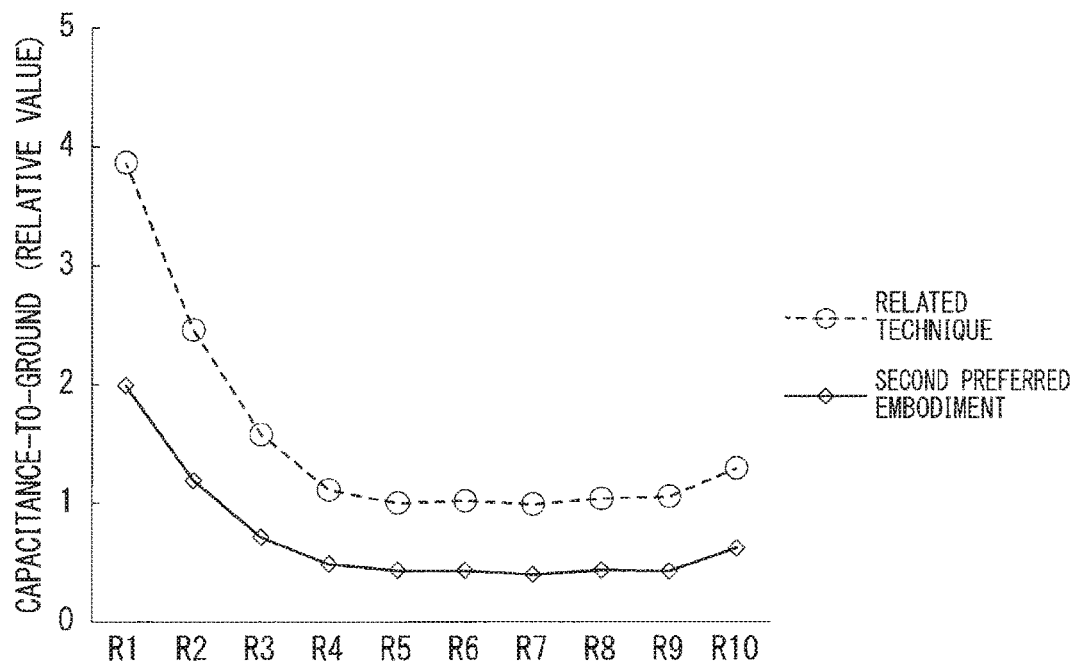
FIG. 10 is a view illustrating results of simulations for relative values of capacitances-to-ground, in the touch screen according to the second preferred embodiment.

FIG. 10 illustrates results of simulations for relative values of capacitances-to-ground, after bonding the touch screen 1 according to the present second preferred embodiment to the IPS liquid crystal display (the display element 51), and disposing ten lead wirings R1 to R10 therein. Note that it is assumed that this touch screen is not provided with the capacitors described in the first preferred embodiment. Further, as a touch screen regarding related techniques, the adhesive member 52 was disposed therein in such a way as to cover the entire surface of the touch screen. It was assumed that the adhesive member 52 had a thickness of 0.5 mm and a relative permittivity of 5.0. In FIG. 10, the capacitance-to-ground of the lead wiring R5 illustrated in FIG. 3 is used as a reference.

As a result thereof, as illustrated in FIG. 10, with the touch screen 1 according to the present second preferred embodiment, it was possible to entirely reduce the capacitances-to-ground, in comparison with the related techniques. This can reduce the capacitance deviation. Accordingly, by applying the present second preferred embodiment to the structure described in the first preferred embodiment (the structure having the capacitors 92 to 96 disposed therein), it is possible to reduce the capacitance variation, the deviation in the parasitic capacitances in the wirings and, consequently, the deviation in the capacitance detecting sensitivities, in comparison with the first preferred embodiment.

Third Preferred Embodiment

A third preferred embodiment of the present invention defines the bonding position of the adhesive member 13 (FIG. 1) for bonding the transparent substrate 14 to the polarization plate which is not illustrated (which is substantially the transparent substrate 10), which can reduce the capacitance-to-ground of the outermost lead wiring R1, and further reduce the capacitance variation. Note that the structure of the touch screen 1 is the same as that described with reference to FIGS. 1 to 8 in the first preferred embodiment.

Figure 11:
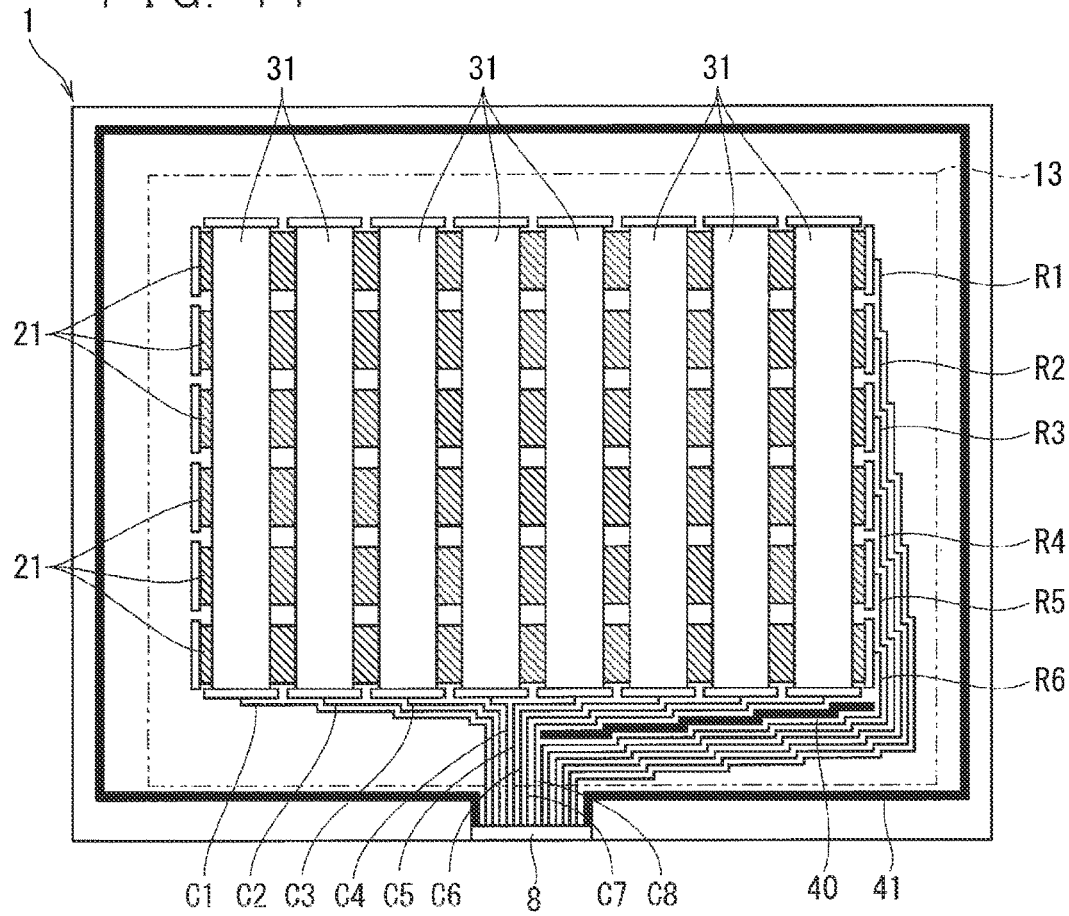
FIG. 11 is a plan view illustrating the structure of a touch screen according to a third preferred embodiment.

FIG. 11 is a plan view illustrating the structure of the touch screen 1 according to the present third preferred embodiment. The lead wirings R1 to R6 and C1 to C8, the column-direction wirings 21 and the row-direction wirings 31 are the same as those in the first preferred embodiment and, therefore, will not be described.

In FIG. 11, an imaginary line (two-dot chain line) indicates the outer contour line of the adhesive member 13. As indicated by the two-dot chain line, the outer contour line of the adhesive member 13 is positioned between the outermost lead with R1 and the outermost shield wiring 41, in a plan view. Namely, in the present third preferred embodiment, the adhesive member (the second adhesive member) 13 for bonding the transparent substrate (the substrate) 14 is disposed in such a way as to overlap with the plurality of column-direction wirings 21 and the plurality of lead wirings R1 to R6 and C1 to C8 while not overlapping with the outermost shield wiring 41, in the plan view.

The adhesive member 13 has a larger permittivity than that of an air layer and, therefore, causes relatively-strong coupling between the outermost lead wiring R1 and the outermost shield wiring 41, due to fringe components. On the contrary, with the aforementioned structure according to the present third preferred embodiment, it is possible to weaken the coupling between the outermost lead wiring R1 and the outermost shield wiring 41, as will be described later.

Figure 12:
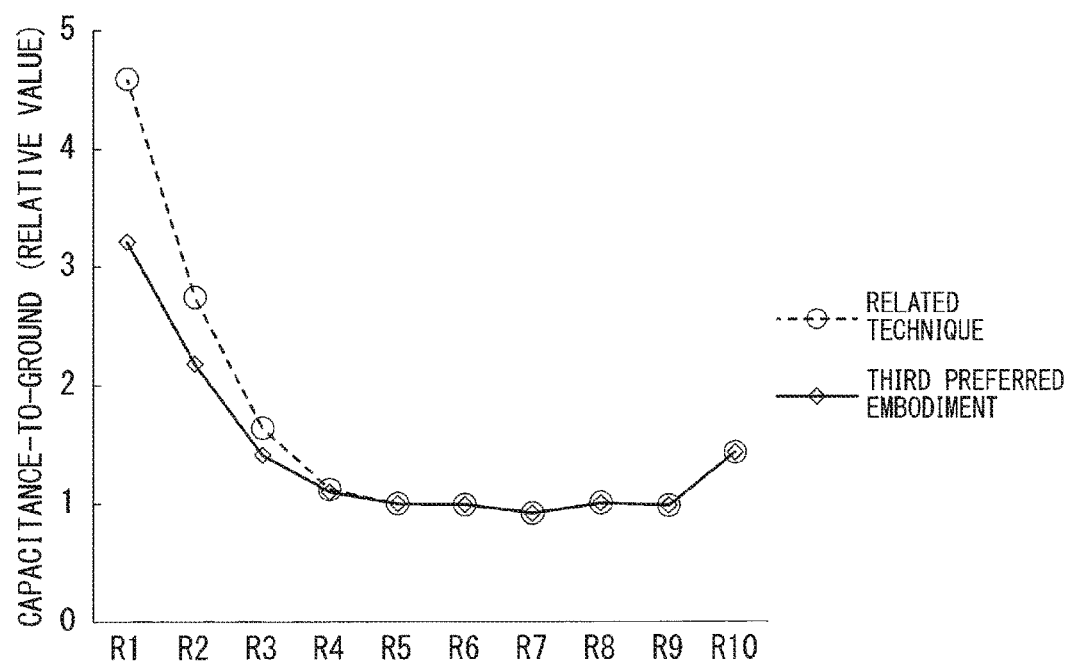
FIG. 12 is a view illustrating results of simulations for relative values of capacitances-to-ground, in the touch screen according to the third preferred embodiment.

FIG. 12 illustrates results of simulations for relative values of capacitances-to-ground, after bonding the touch screen 1 according to the present third preferred embodiment to the IPS liquid crystal display (the display element 51), and disposing ten lead wirings R1 to R10 therein. Note that it is assumed that this touch screen is not provided with the capacitors described in the first preferred embodiment. Further, as a touch screen regarding related techniques, the adhesive member 13 was disposed in such a way as to cover the entire surface of the touch screen. It was assumed that the adhesive member 13 had a thickness of 0.2 mm and a relative permittivity of 5.0. The reference value of the capacitance-to-ground is the same as that of FIG. 3.

As a result thereof, as illustrated in FIG. 12, with the touch screen according to the present third preferred embodiment, it was possible to reduce the capacitance-to ground of the outermost lead wiring R1, in comparison with the related techniques. This can reduce the capacitance deviation. Accordingly, by applying the present third preferred embodiment to the structure described in the first preferred embodiment (the structure having the capacitors 92 to 96 disposed therein), it is possible to reduce the capacitance variation, the deviation in the parasitic capacitances in the wirings and, consequently, the deviation in the capacitance detecting sensitivities, in comparison with the first preferred embodiment.

Modification Examples of First to Third Preferred Embodiments

Figure 13:
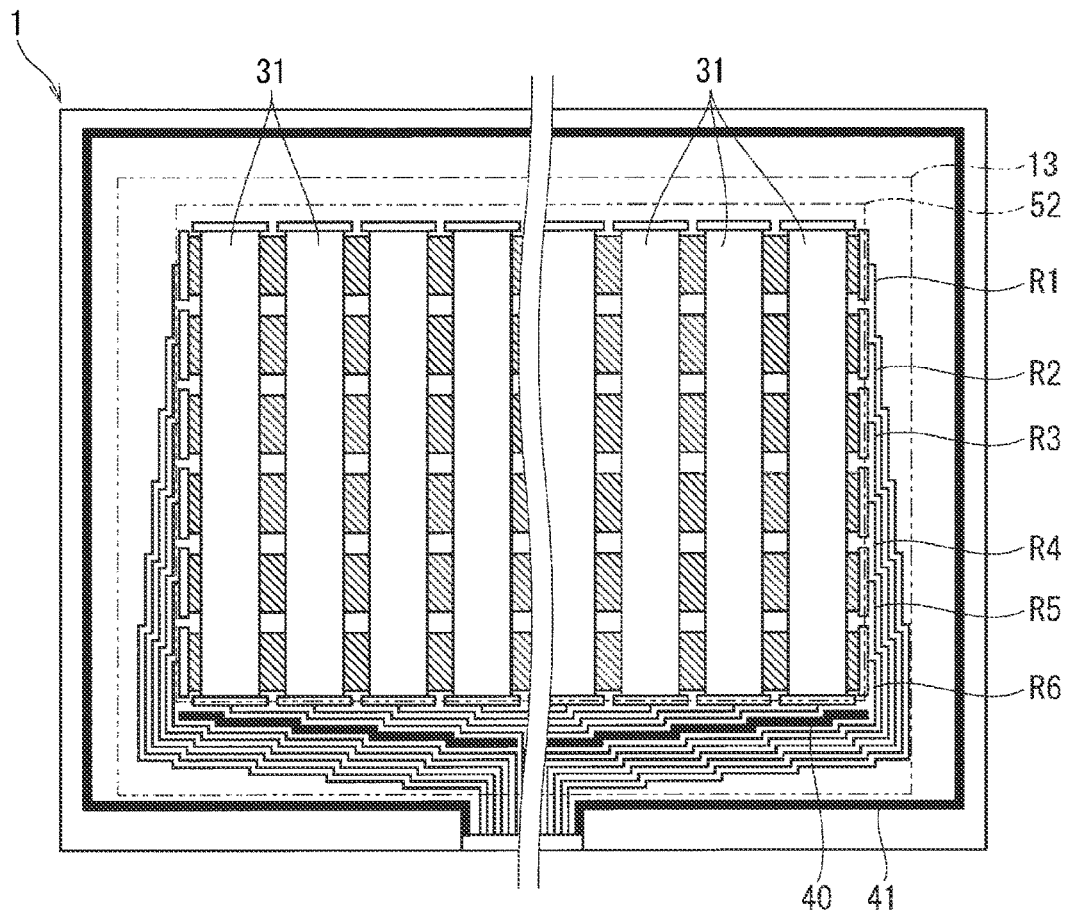
FIG. 13 is a plan view illustrating the structure of a touch screen in a modification example of the first to third preferred embodiments.

In the aforementioned first to third preferred embodiments, the lead wirings are connected to respective one ends of the column-direction wirings 21. However, the present invention is not limited thereto, and the lead wirings can also be connected to the opposite ends of the column-direction wirings 21. FIG. 13 illustrates an example where the lead wirings R1 to R6 are connected to the column-direction wirings 21 at both their left and right sides. In this case, it is possible to effectively reduce the load constituted by the resistances and the capacitances of the column-direction wirings 21, which can increase the detection speed.

Figure 14:
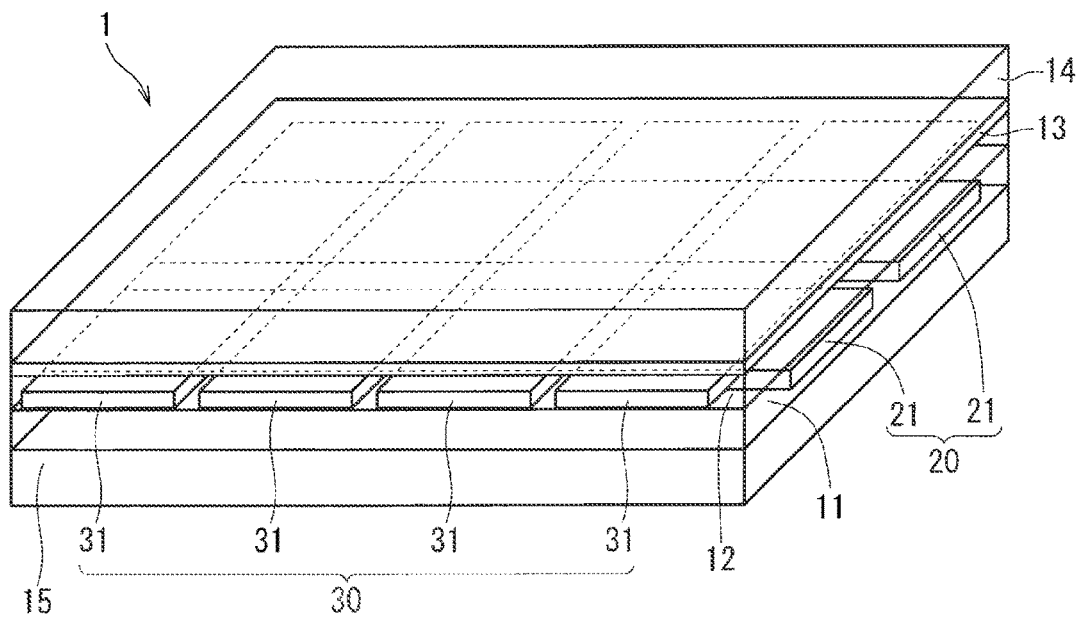
FIG. 14 is a perspective view illustrating the layer configuration of a touch screen in a modification example of the first to third preferred embodiments.

Further, in the first and third preferred embodiments, instead of the aforementioned transparent substrate 10 illustrated in FIG. 1, it is possible to provide a liquid-crystal-display color filter substrate. FIG. 14 is a perspective view of the layer configuration of the touch screen 1. In the example illustrated in FIG. 14, a lower electrode 20, an inter-layer insulation film 11, an upper electrode 30 and a protective film 12 are formed, in the mentioned order, on the display surface of a color filter substrate 15. On the upper surfaces thereof, there is provided a transparent substrate 14 formed from a transparent glass material or a transparent resin. In this case, the color filter substrate 15 in the liquid crystal display (the display element 51) also functions as the transparent substrate 10 in the touch screen 1, which enables reduction of the thickness of the structure of the touch screen 1 mounted on the liquid crystal display.

Fourth Preferred Embodiment

Figure 15:
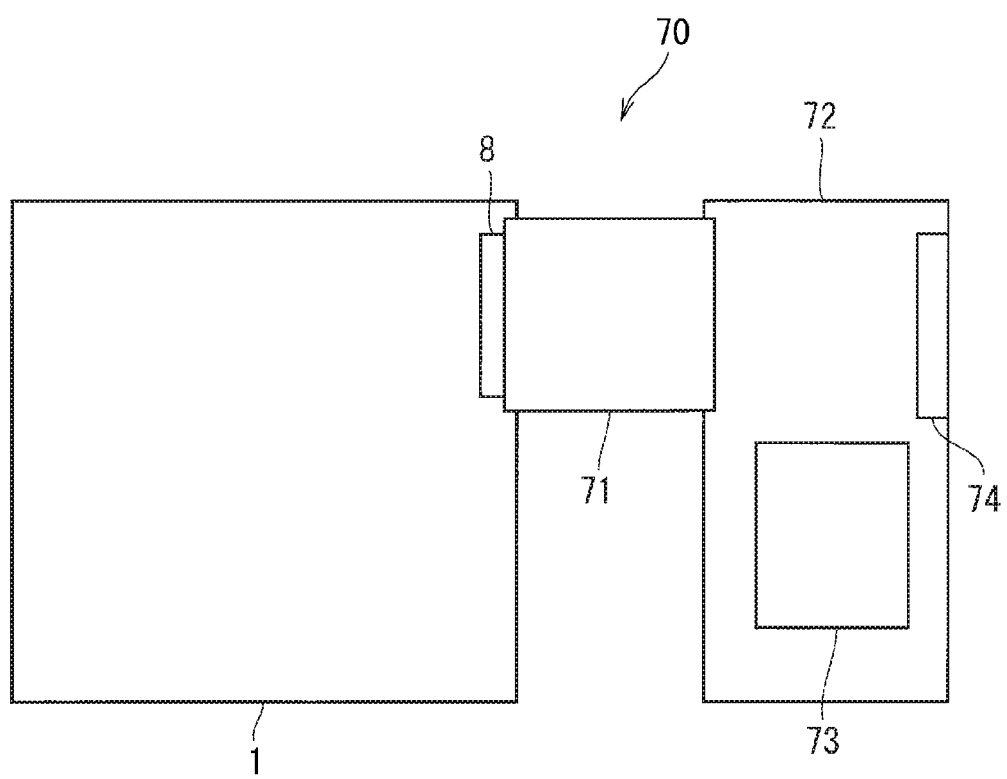
FIG. 15 is a plan view illustrating the structure of a touch panel according to a fourth preferred embodiment.

FIG. 15 is a plan view schematically illustrating the structure of a touch panel 70 according to a fourth preferred embodiment of the present invention. The touch panel 70 includes the touch screen 1 according to the first preferred embodiment illustrated in FIG. 1, a flexible printed substrate 71, and a controller substrate 72.

Corresponding terminals of the flexible printed substrate 71 are mounted to the respective terminals 8 in the touch screen 1, using an anisotropic conductive film (abbreviated as an ACF) or the like. Note that for convenience, the position of the terminals 8 in the touch screen 1 in FIG. 15 is changed from the position of the terminals 8 in FIG. 2 and the like.

Through the flexible printed substrate 71, end portions of the column-direction wirings 21 and the row-direction wirings 31 in the touch screen 1 are electrically connected to the controller substrate 72, so that the touch screen 1 functions as a main component of the touch panel 70.

A detection processing circuit 73 for touched-position detection is mounted on the controller substrate 72. The detection processing circuit 73 detects the touch capacitance formed from the capacitance formed between the indication body and a detection column wiring 3 (a column-direction wiring 21) and a detection row wiring 2 (a row-direction wiring 31) by applying a signal voltage thereto. Then, based on the result of this detection (the touch capacitance), the detection processing circuit 73 performs processing for calculating the position on the touch screen 1, which has been indicated by the indication body (the touched position). Note that the detection processing circuit 73 can be adapted to employ detection logics of projected capacitive types.

The controller substrate 72 includes an external connection terminal 74 which outputs, to an external processing device, the result of the processing for calculating the touch coordinates by the detection processing circuit 73.

The touch panel 70 having the aforementioned structure according to the present fourth preferred embodiment includes the touch screen 1 according to the aforementioned first preferred embodiment. This can suppress the deviation in the parasitic capacitances in the wirings, which allows the touch panel 70 to have a reduced capacitance-detection-sensitivity deviation.

Note that in the aforementioned description, the touch panel 70 has been described as being structured to include the touch screen 1 according to the first preferred embodiment. However, the touch panel 70 is not limited thereto and may also include the touch screen 1 according to the second or third preferred embodiment, instead of the touch screen 1 according to the first preferred embodiment. Further, the detection processing circuit 73 and the like on the controller substrate 72 may also be formed directly on the transparent substrate 10, rather than on the controller substrate 72. These modification examples can be similarly applied to fourth and fifth preferred embodiments which will be described later.

Fifth Preferred Embodiment

A display device according to a fifth preferred embodiment of the present invention is configured to include the touch panel 70 (FIG. 5) and the display element 51 (FIG. 1), which are integrated. The touch screen 1 in the touch panel 70 is disposed closer to a user than the display screen in the display element 51 and overlaps with the display element 51. Since the touch panel 70 is mounted in the user side with respect to the display screen of the display element 51, as described above, the display device equipped with the touch panel is structured to have the function of detecting touched positions indicated by the user.

The display device having the aforementioned structure according to the present fifth preferred embodiment includes the touch panel 70 (the touch screen 1) having a reduced capacitance-detection-sensitivity deviation. Accordingly, this can allow the display device equipped with the projected-capacitive type touch panel to have a reduced capacitance-detection-sensitivity deviation.

Sixth Preferred Embodiment

An electronic apparatus according to a sixth preferred embodiment of the present invention includes the display device according to the aforementioned fifth preferred embodiment (the configuration including the touch panel 70 illustrated in FIG. 15 and the display element 51 illustrated in FIG. 1 which are integrated), and a signal processing element as an electronic element. The signal processing element performs processing using outputs from the external connection terminal 74 in the touch panel 70 as input signals and outputs digital signals resulting from this processing. Since the signal processing element is connected to the touch panel 70, the electronic apparatus is structured to have a touched-position detecting function as a digitizer or the like for outputting detected touched positions to an external signal processing device such as a computer.

Note that the signal processing element can also be incorporated in the controller substrate 72. By structuring the signal processing element such that it has an outputting function in such a way as to conform to bus standards, such as an USB (Universal Serial Bus), the electronic apparatus having the touched-position detecting function is allowed to have excellent versatility.

The electronic apparatus having the aforementioned structure according to the present sixth preferred embodiment includes the touch panel 70 (the touch screen 1) having a reduced capacitance-detecting-sensitivity deviation. Accordingly, this can allow the electronic apparatus having the projected-capacitive type touched-position detecting function to have a reduced capacitance-detection-sensitivity deviation.

While the invention has been shown and described in detail, the foregoing description is in all aspects illustrative and not restrictive. It is therefore understood that numerous modifications and variations can be devised without departing from the scope of the invention.

What is claimed is:

1. A touch screen comprising:
a plurality of sensor wirings extending in a predetermined extending direction;
a plurality of lead wirings which is connected to end portions of said plurality of sensor wirings and extends along an outer periphery of an area in which said plurality of sensor wirings is disposed;
a first shield wiring surrounding said plurality of sensor wirings and said plurality of lead wirings; and
a capacitor which comprises a first electrode and a second electrode which are apart from each other and is connected to said end portions of said sensor wirings; wherein:
a distance between said first shield wiring and an outermost lead wiring which is an outermost wiring, out of said plurality of lead wirings, is larger than intervals between said plurality of lead wirings,
each of said first electrode and said second electrode includes an extending portion extending in said extending direction,
said first electrode includes, as said extending portion, a connection portion out of said lead wirings connected to said sensor wirings, said connection portion extending along an extension line of said sensor wirings, from a point at which said lead wirings are connected to said sensor wirings, and
said second electrode includes, as said extending portion, a correction capacitance electrode disposed in a direction parallel to said extending direction with respect to said connection portion,
the touch screen further comprising:
a second shield wiring which is disposed outside said area in which said sensor wirings are disposed and is connected to said correction capacitance electrode, wherein
said second shield wiring does not overlap with said lead wiring adjacent to an inner side of said outermost lead wiring in a plan view.

2. The touch screen according to claim 1, wherein said first electrode and said second electrode are close to each other without overlapping with each other in a plan view.

3. The touch screen according to claim 2, further comprising
an inter-layer insulation film that separates said first electrode and said second electrode from each other, wherein
an interval between said first electrode and said second electrode in a plan view is equal to or more than three times a film thickness of said inter-layer insulation film.

4. The touch screen according to claim 1, wherein said first electrode further includes a first pectinate portion extending in a direction perpendicular to said extending direction, and
said second electrode further includes a second pectinate portion which extends in a direction perpendicular to said extending direction and engages with said first pectinate portion of said first electrode in a plan view.

5. The touch screen according to claim 1, wherein said capacitor is connected to said lead wirings other than said outermost lead wiring.

6. The touch screen according to claim 1, wherein the touch screen is bonded to a display element through a first adhesive member disposed in such a way as to overlap with said plurality of sensor wirings without overlapping with said plurality of lead wirings, in a plan view.

7. The touch screen according to claim 6, further comprising:
a substrate forming a surface of said touch screen; and
a second adhesive member which bonds said substrate and is disposed in such a way as to overlap with said plurality of sensor wirings and said plurality of lead wirings, without overlapping with said first shield wiring, in a plan view.

8. A touch panel comprising:
the touch screen according to claim 1; and
a detection processing circuit that detects a position on said touch screen, which has been indicated by an indication body, based on a capacitance formed between said indication body and said plurality of sensor wirings.

9. A display device comprising:
the touch panel according to claim 8; and
a display element overlapping with said touch screen in said touch panel.

10. An electronic apparatus comprising:
the display device according to claim 9; and
an electronic element that performs processing an output from said detection processing circuit in said touch panel, as an input signal.

* * * * *